(12) United States Patent
Shimizu

(10) Patent No.: US 7,791,919 B2
(45) Date of Patent: Sep. 7, 2010

(54) SEMICONDUCTOR MEMORY DEVICE CAPABLE OF IDENTIFYING A PLURALITY OF MEMORY CHIPS STACKED IN THE SAME PACKAGE

(75) Inventor: Yuui Shimizu, Yokohama (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 133 days.

(21) Appl. No.: 12/270,292

(22) Filed: Nov. 13, 2008

(65) Prior Publication Data

US 2009/0135638 A1    May 28, 2009

(30) Foreign Application Priority Data

Nov. 22, 2007  (JP)  ............................. 2007-303307

(51) Int. Cl.
  *G11C 5/04* (2006.01)
(52) U.S. Cl. .......................................... 365/51; 365/63
(58) Field of Classification Search .................... 365/72
  See application file for complete search history.

(56) References Cited

U.S. PATENT DOCUMENTS

| | | | |
|---|---|---|---|
| 6,624,506 B2 | 9/2003 | Sasaki et al. | |
| 6,791,175 B2 | 9/2004 | Matsuo et al. | |
| 6,991,964 B2 | 1/2006 | Matsuo et al. | |
| 7,327,592 B2 * | 2/2008 | Silvestri | ...................... 365/63 |

FOREIGN PATENT DOCUMENTS

JP   2003-110086   4/2003

OTHER PUBLICATIONS

Dongsoo Lee, et al., "Excellent uniformity and reproducible resistance switching characteristics of doped binary metal oxides for non-volatile resistance memory applications", IEDM 2006 30.8.1., 4 pages.

Y. Hosoi, et al., "High Speed Unipolar Switching Resistance RAM (RRAM) Technology", IEDM 2006 30.7.1., 4 pages.

* cited by examiner

*Primary Examiner*—Tan T. Nguyen
(74) *Attorney, Agent, or Firm*—Oblon, Spivak, McClelland, Maier & Neustadt, L.L.P.

(57) ABSTRACT

A semiconductor memory device is configured to vertically stack a plurality of memory chips using a resistance-change memory element as a memory cell in one package. The memory chips each have first and second memory position detection pads connected via chip top and bottom electrodes facing each other. Of the vertically stacked memory chips, the lowermost memory chip is provided with the connected chip bottom electrodes of the first and second memory position detection pads. The memory chips each control the variable resistance element, and in a state that the first memory position detection pad has a higher resistance than the second memory position detection pad, compare a voltage applied to the first memory position detection pad with the chip position detection signal using the comparator when a voltage is applied between the first and second memory position detection pads provided on the uppermost layer memory chip.

20 Claims, 14 Drawing Sheets

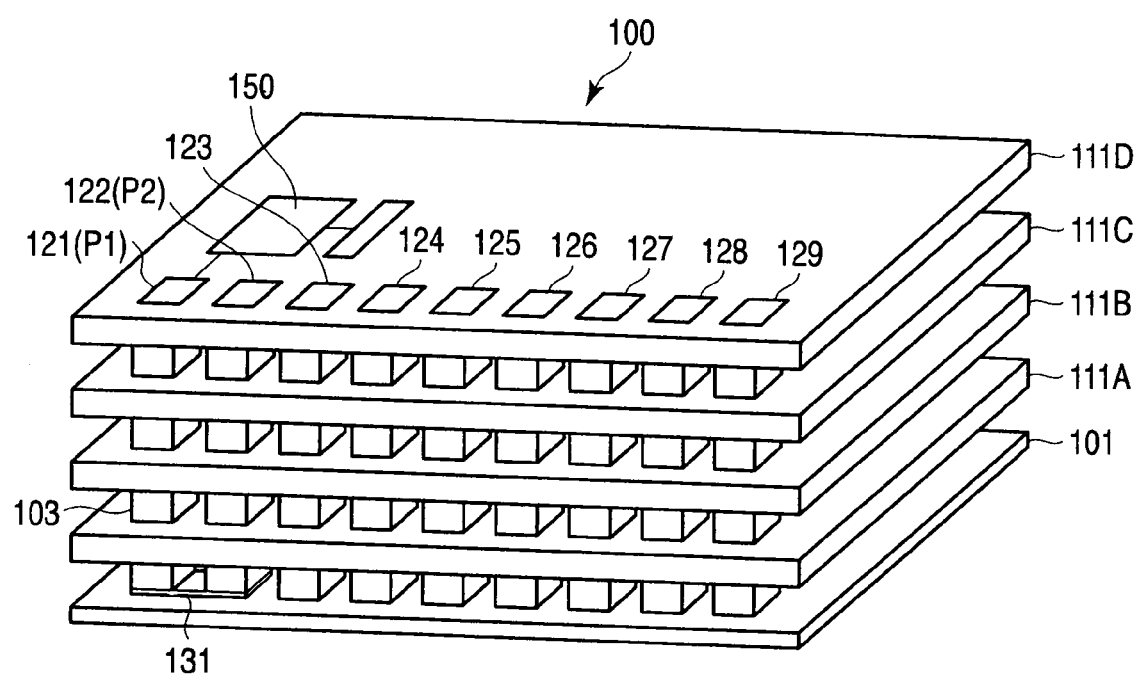
F I G. 1

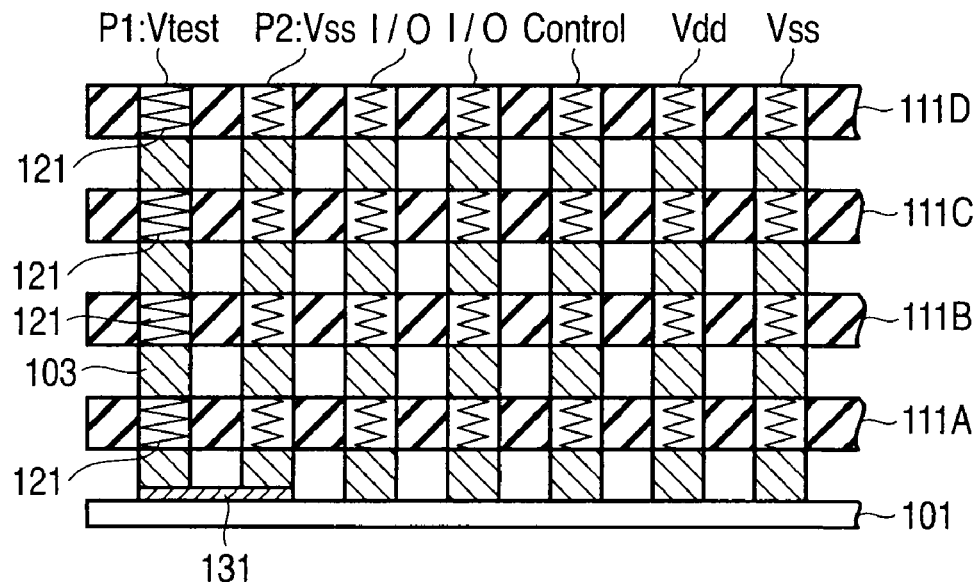
F I G. 2
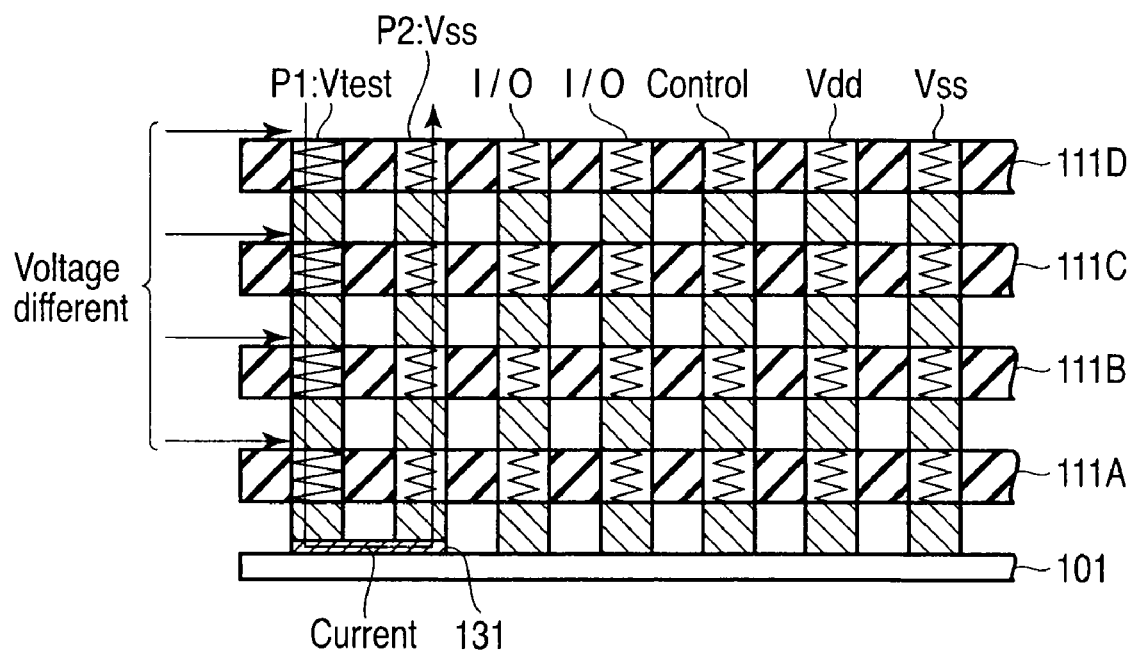
F I G. 3

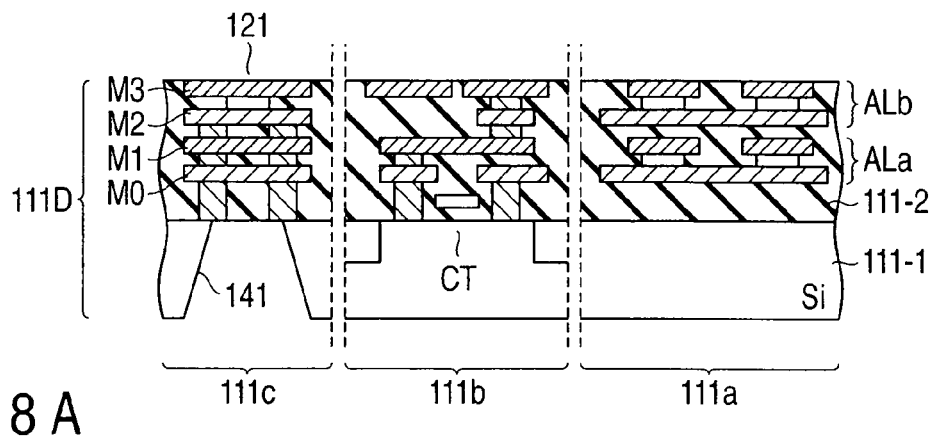
F I G. 8 A
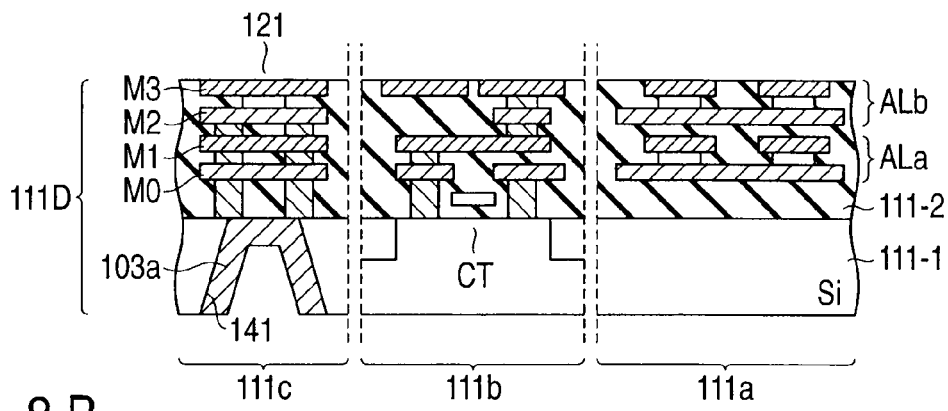
F I G. 8 B
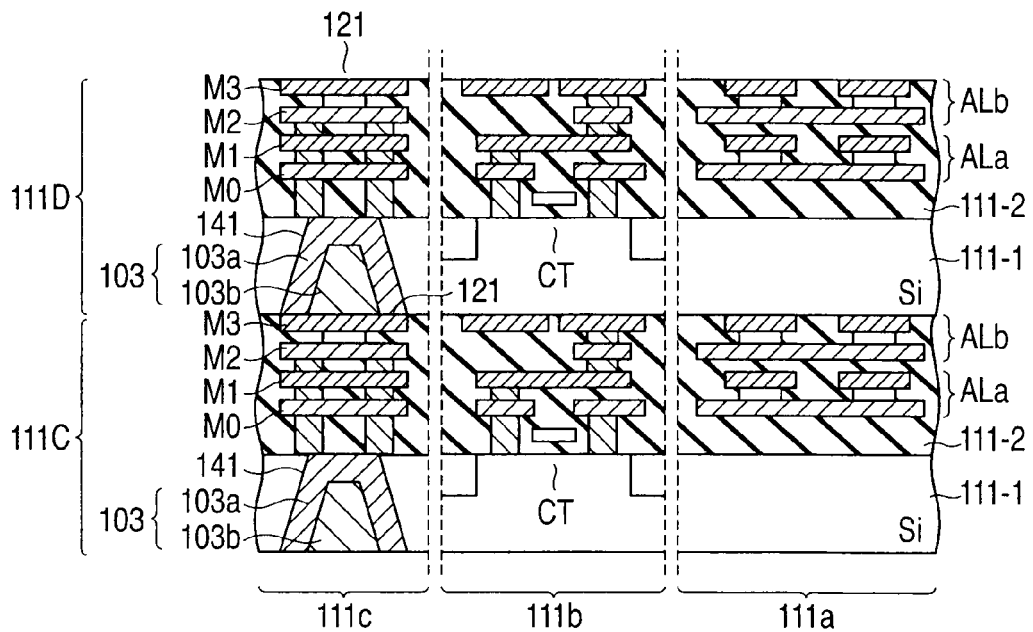
F I G. 8 C

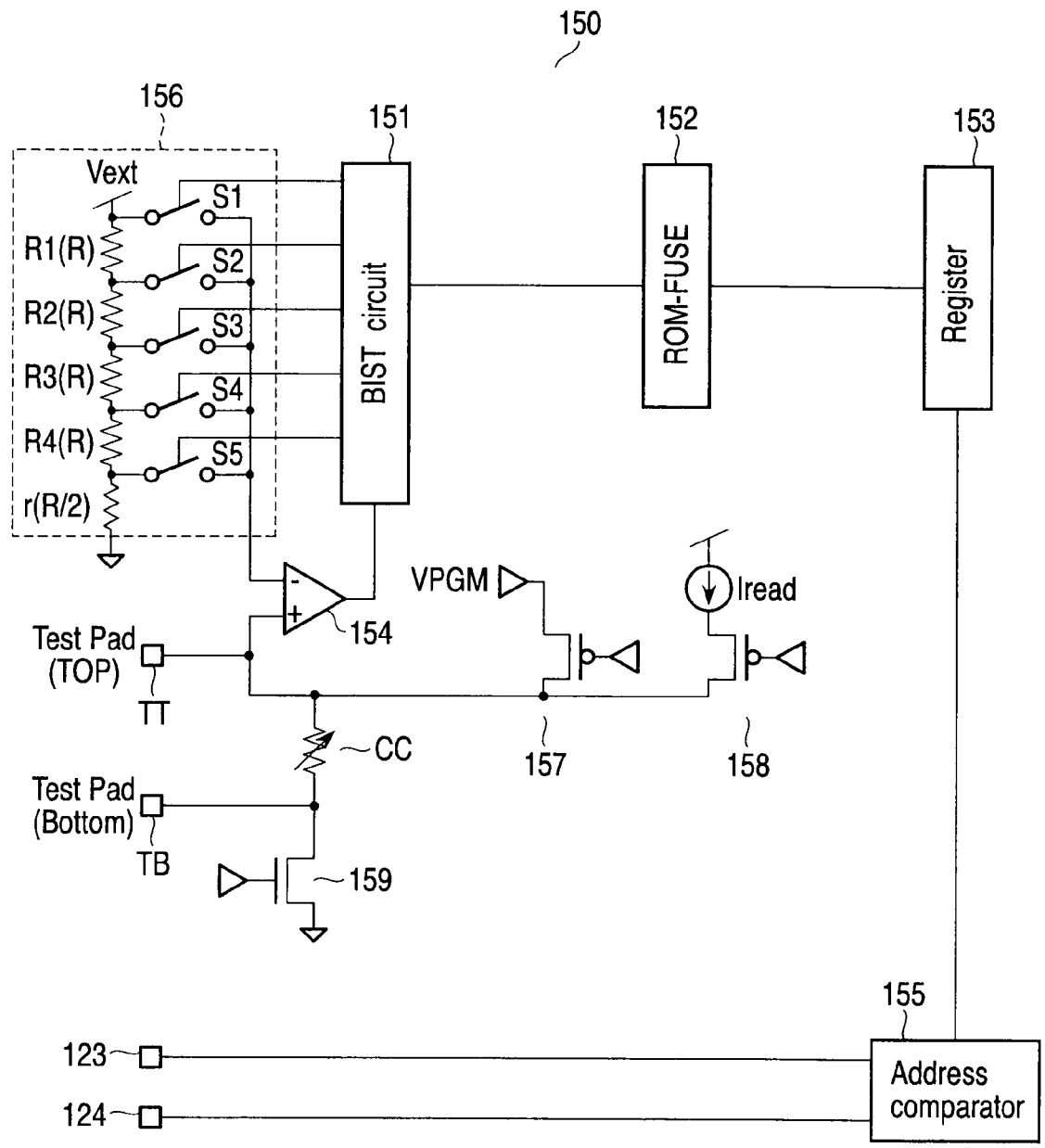
F I G. 9

|  | | V@SampleNode | | | |
|---|---|---|---|---|---|
|  | | 7/9 | 5/9 | 3/9 | 1/9 |
| V@(Test Pad) | 1 | 0 | 0 | 0 | 0 |
|  | 0.75 | 1 | 0 | 0 | 0 |
|  | 0.5 | 1 | 1 | 0 | 0 |
|  | 0.25 | 1 | 1 | 1 | 0 |
300
F I G. 1 0
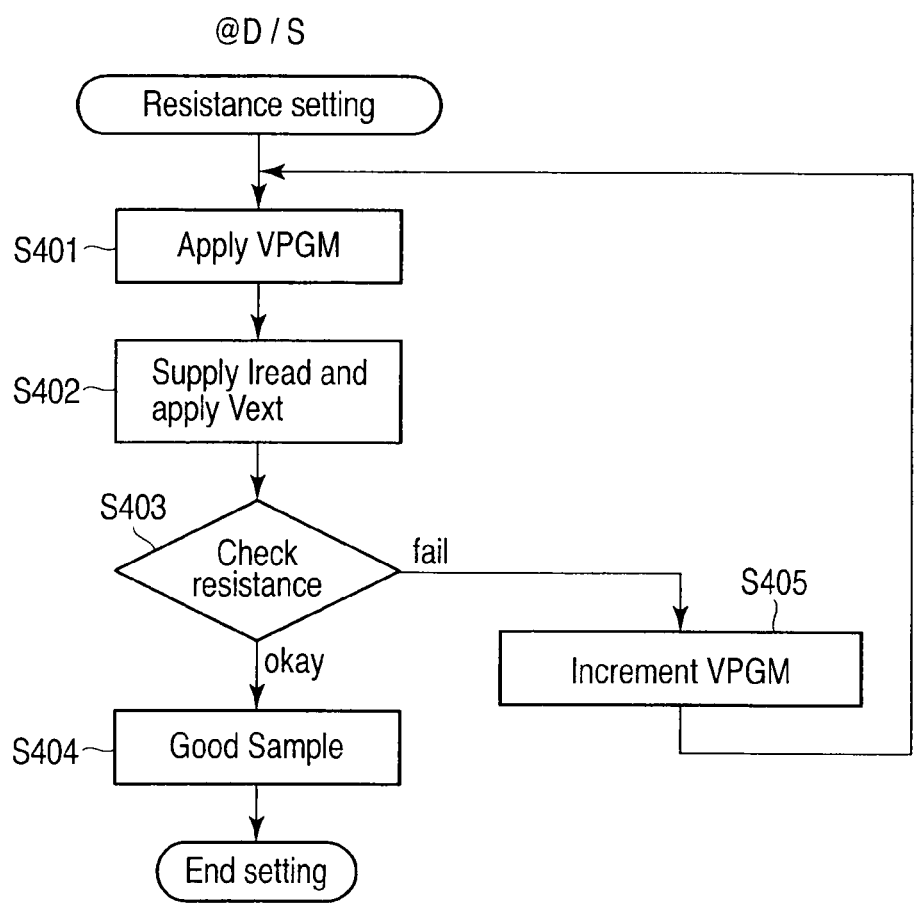
F I G. 1 1

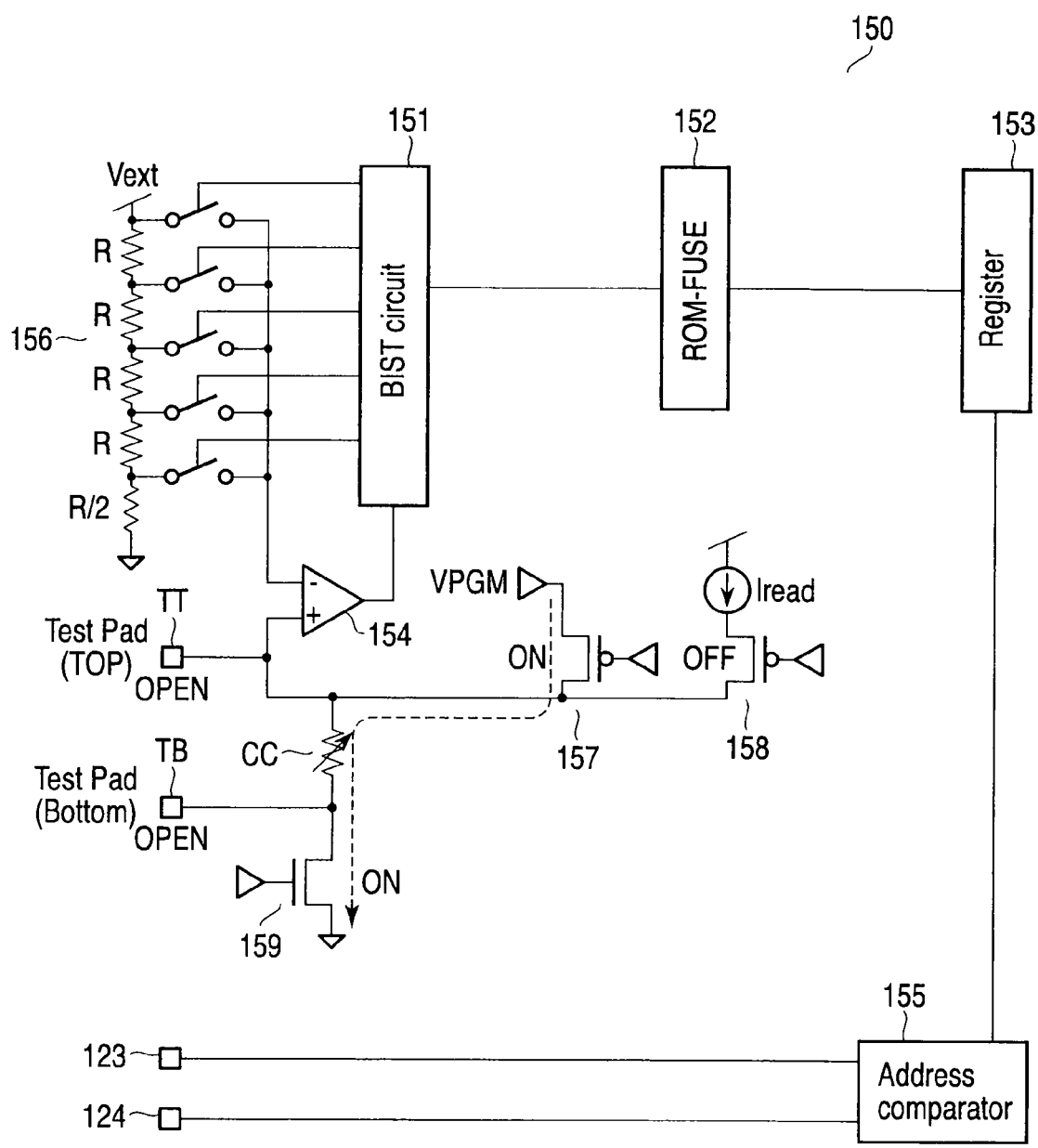
F I G. 12

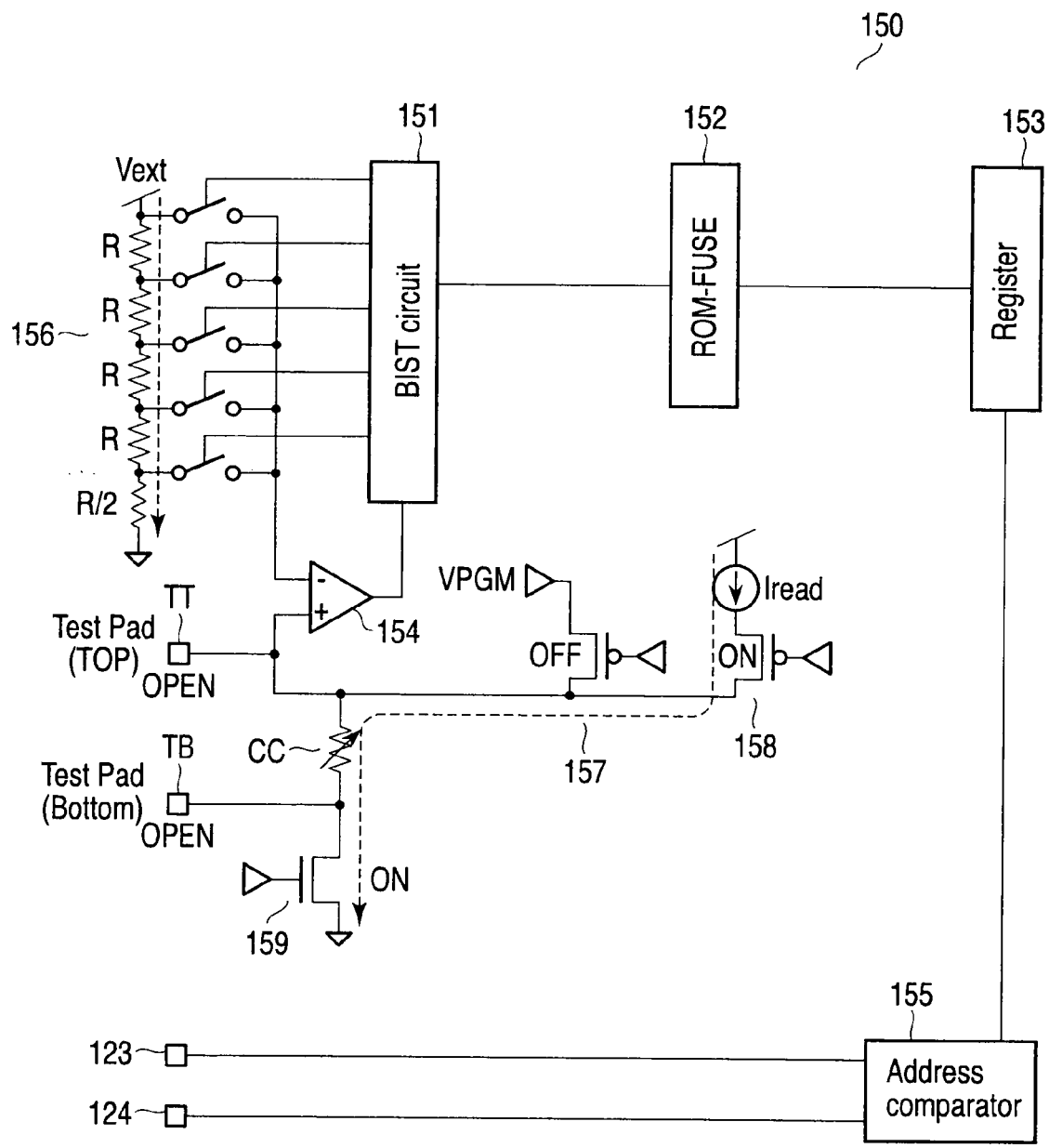
F I G. 13

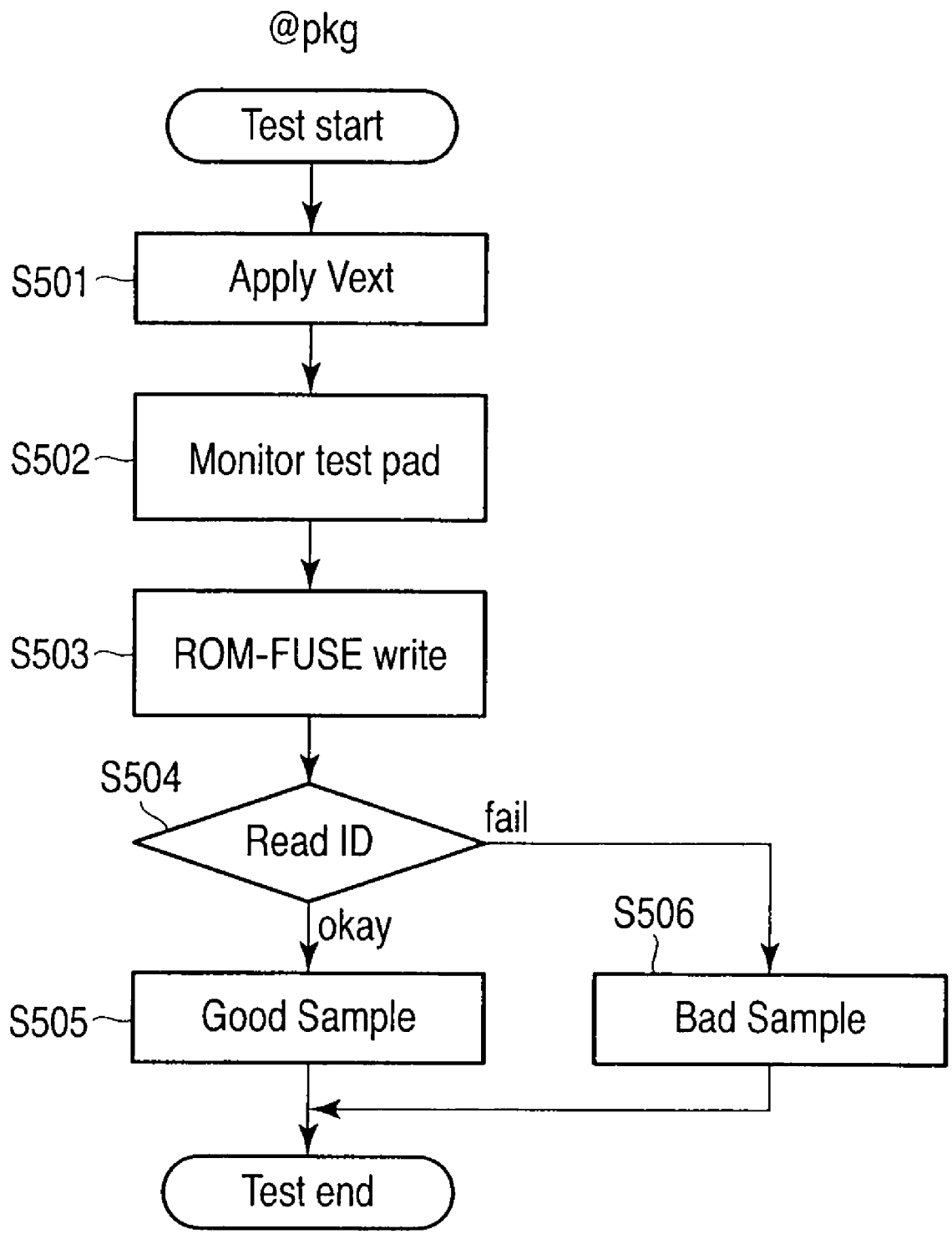
F I G. 14

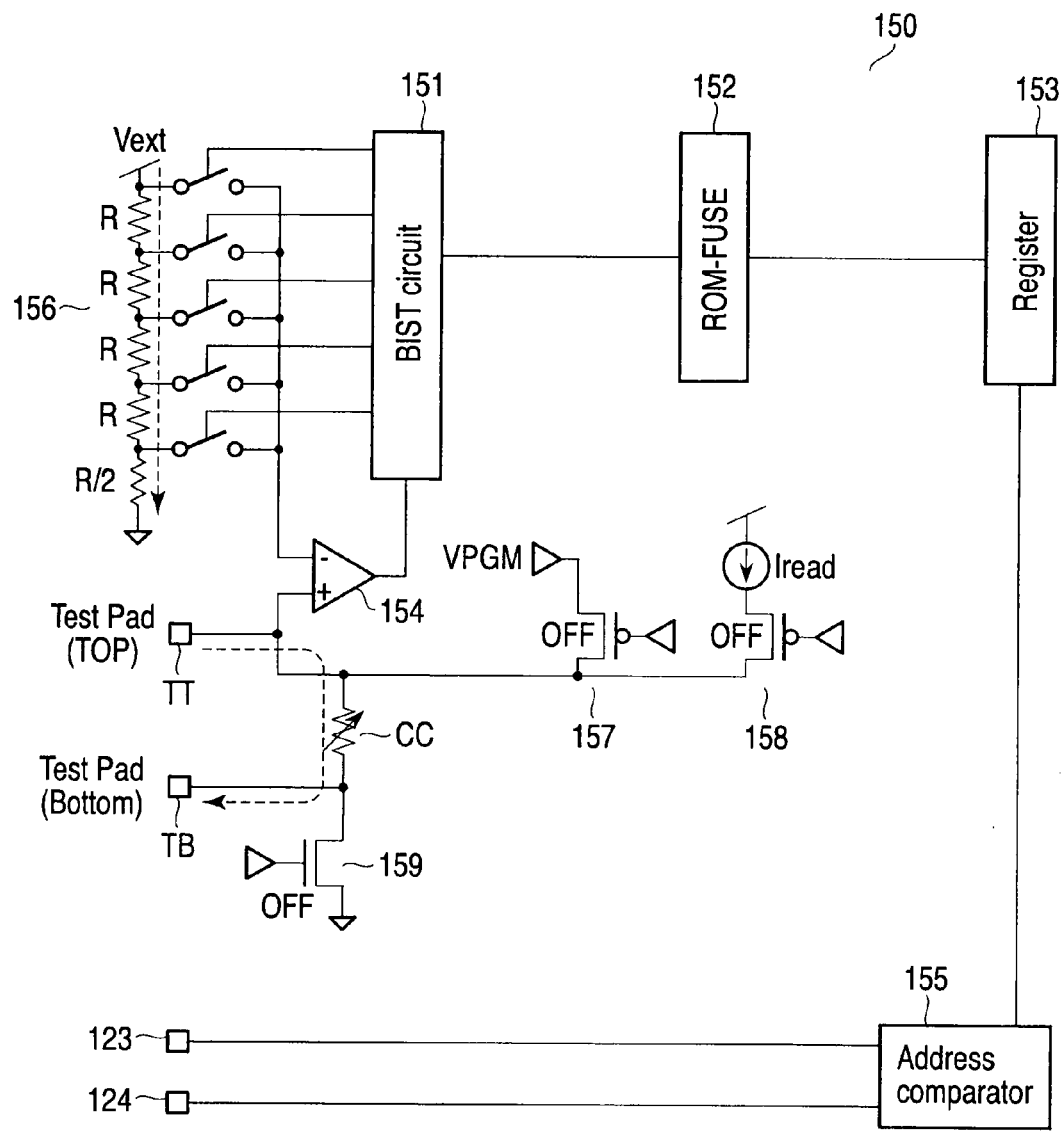
F I G. 1 5
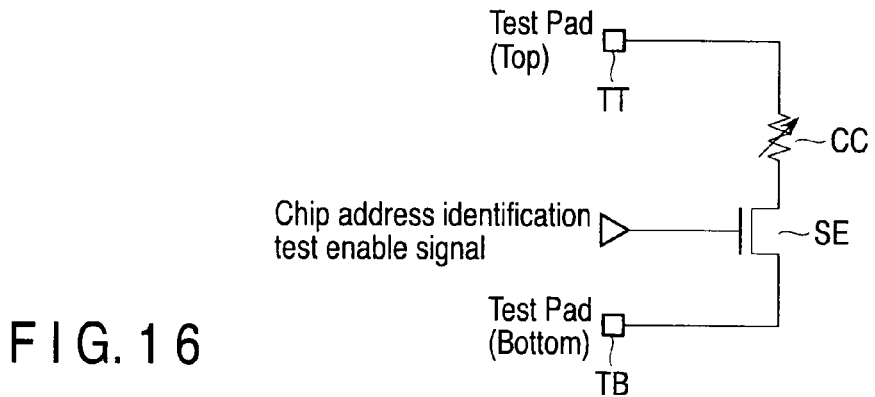
F I G. 1 6

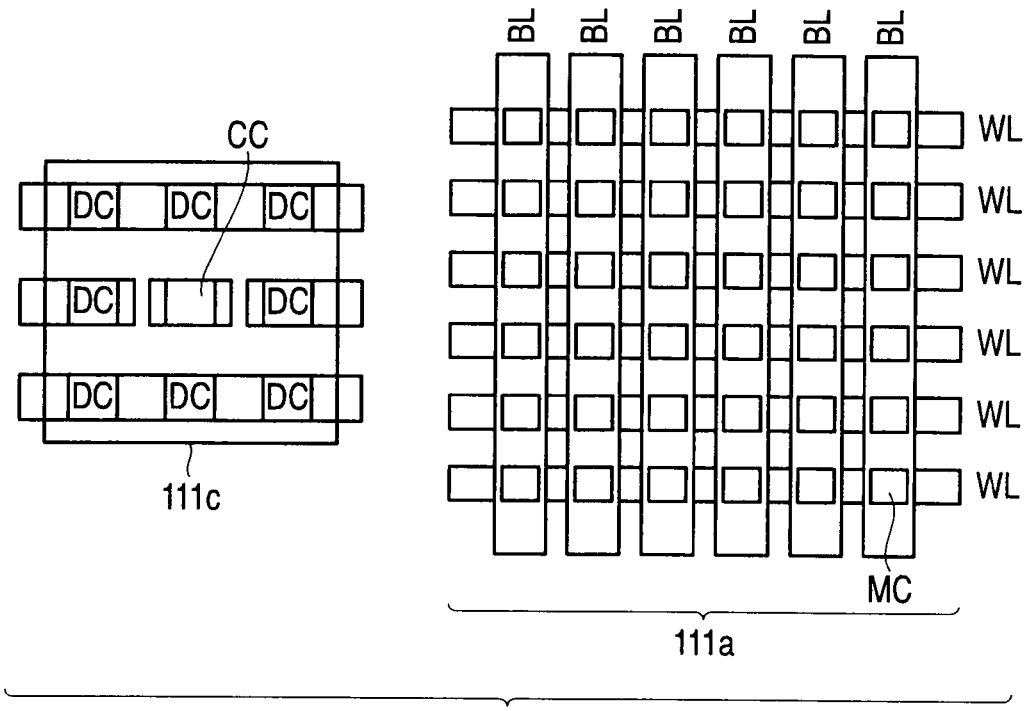
F I G. 19
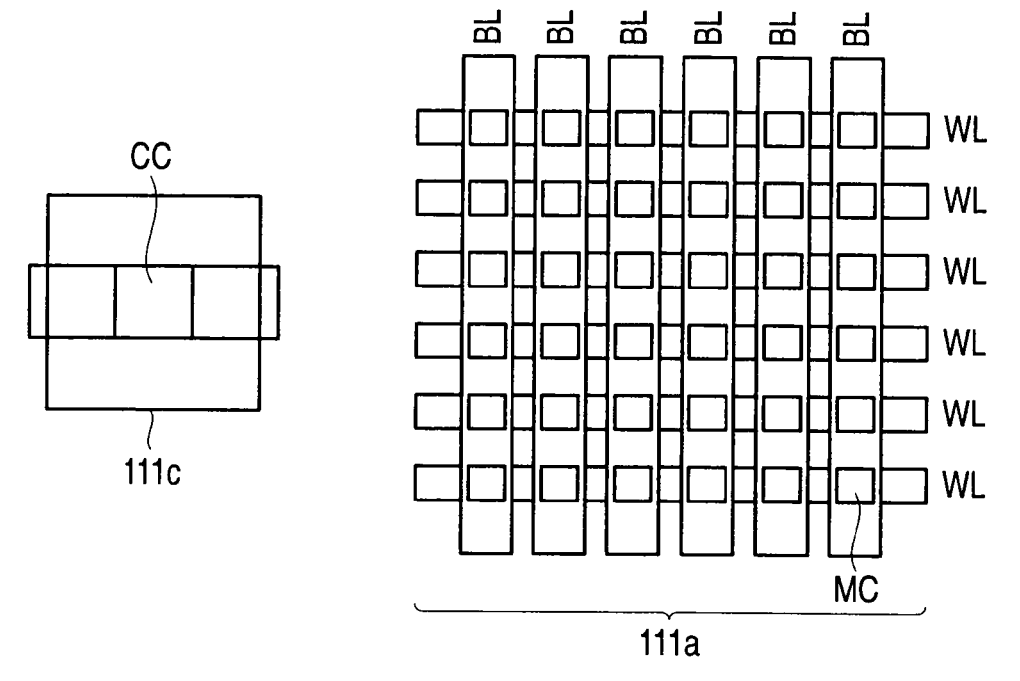
F I G. 20

SEMICONDUCTOR MEMORY DEVICE CAPABLE OF IDENTIFYING A PLURALITY OF MEMORY CHIPS STACKED IN THE SAME PACKAGE

CROSS-REFERENCE TO RELATED APPLICATIONS

This application is based upon and claims the benefit of priority from prior Japanese Patent Application No. 2007-303307, filed Nov. 22, 2007, the entire contents of which are incorporated herein by reference.

BACKGROUND OF THE INVENTION

1. Field of the Invention

The present invention relates to a semiconductor memory device. More specifically, the present invention relates to a stacked-type semiconductor memory device (e.g., a multi-chip package [MCP] structure memory device) using a resistance-change memory element as a memory cell.

2. Description of the Related Art

It is essential to achieve a large capacity in development f memory devices such as flash memory. The memory devices have very important meanings to keep price competitiveness depending on in the following technique. According to the technique, a chip having the same memory capacity is realized using a smaller chip size.

A multi-chip package has been developed as a technique of relatively simple increasing the memory capacity of the same package. For example, in a multi-chip package structure memory device, a plurality of the same memory chips is stacked and packaged in one package.

The foregoing multi-chip package structure memory device has the following problem. Specifically, inherent chip addresses (row address, column address) must be given to a plurality of stacked memory chips. If not so, all memory chips make the same operation; as a result, there is no meaning of stacking memory chips.

The following technique is given as one course to solve the foregoing problem. According to the technique, each memory chip has a chip address identification pad. For example, bonding with respect to the foregoing pad is changed as "Chip ID [1:0]=⌈Vss, Vss⌋ or ⌈Vss, Vdd⌋" every memory chip. In this way, memory chip only corresponding to the chip address is selectable in each of a program (write) or read operation. Namely, a mutually different ID is assigned to the chip address identification pad of each memory chip.

Recently, development of a memory chip using a resistance-change memory element as a memory cell has been aggressively made (for example, see IEDM 2006 30. 8 "Excellent uniformity and reproducible resistance switching characteristics of doped binary metal oxides for non-volatile resistance memory applications", VLSI Circuits 2007 p 186 "Time Discrete Voltage Sensing and Iterative Programming Control for a $4F^2$ Multilevel CBRAM"). The foregoing memory chip can execute a high-speed write operation as compared with a flash memory, and stacking is relatively easy. Considering the foregoing point, the memory chip has attracted much interest.

As described above, in the multi-chip package structure memory device, each memory chip of the package is identified by switching the bonding. However, the multi-chip package structure memory device must stack a plurality of memory chips in the package. In this case, the area and shape of the package are limited. Thus, preferably, each memory chip is stacked so that it is overlapped without shifting a position of each memory chip. In this case, short-circuit is made between pads of vertically overlapping memory chips, and thereby, there is no need to bond each memory chip; therefore, assembly is very easy. However, according to the foregoing technique, different ID is not set to the chip address identification pad of each memory chip. In other words, the same chip address is assigned to all the chip address identification pads of each memory chip. For this reason, there is a problem that it is impossible to identify each memory chip of the package.

Incidentally, a stacked-type semiconductor device capable of solving the foregoing problem has been already proposed (see, for example, Jpn. Pat. Appln. KOKAI Publication No. 2003-110086). However, the proposed stacked-type semiconductor device is applicable to a non-volatile memory chip such as NAND $E^2$ PROM. Therefore, it is desired to provide a effective method of identifying each of a plurality of memory chips in the package in the multi-chip package structure memory device, which stacks a memory chip using a resistance-change memory element as a memory cell.

BRIEF SUMMARY OF THE INVENTION

According to a first aspect of the present invention, there is provided a semiconductor memory device including a plurality of memory chips each using a resistance-change memory element as a memory cell, and having a pad having a through silicon via structure (TSV) including a chip top electrode of a chip surface and a chip bottom electrode of a chip backside, comprising: the memory chips each including: a first memory position detection pad provided at the pad part; a second memory position detection pad provided at the pad part; at least one variable resistance element provided corresponding to the first memory position detection pad, the variable resistance element having one terminal connected to the chip top electrode of the first memory position detection pad, and the other terminal connected to the chip bottom electrode of the first memory position detection pad; and a comparator having one input terminal connected with the chip top electrode of the first memory position detection pad, and the other input terminal supplied with a chip position detection signal, the memory chips being configured so that the first and second memory position detection pads are connected via the chip top and bottom electrodes facing each other, of the vertically stacked memory chips, the chip bottom electrode of the first memory position detection pad and the chip bottom electrode of the second memory position detection pad provided on the lowermost memory chip being connected, the memory chips each controlling the variable resistance element, and in a state that the first memory position detection pad has a higher resistance than the second memory position detection pad, comparing a voltage applied to the first memory position detection pad with the chip position detection signal using the comparator when a voltage is applied between the first and second memory position detection pads provided on the uppermost layer memory chip, and thereby, detecting a stacked position of the memory chip in the package and recognizing a chip address in accordance with the stacked position from the comparison result.

According to a second aspect of the present invention, there is provided a semiconductor memory device comprising: a plurality of memory chips vertically stacked in one package, the memory chips each including: a plurality of memory cells using a resistance-change memory element; a through silicon via structure (TSV) pad including first and second memory position detection pads, and having a chip top electrode on a chip surface and a chip bottom electrode of a chip backside; at least one variable resistance element provided corresponding to the first memory position detection pad, the variable resistance element having the same configuration as the memory cell, and having one terminal connected to the chip top electrode of the first memory position detection pad, and the other terminal connected to the chip bottom electrode of the first memory position detection pad; and an address identification circuit detecting a stacked position of the corresponding memory chip in the package, and recognizing a chip address in accordance with the stacked position, the memory chips further including: a via connecting the first memory position detection pads and the second memory position detection pads via the chip top and bottom electrodes facing each other; and a conductor pattern connecting the chip bottom electrode of the first memory position detection pad and the chip bottom electrode of the second memory position detection pad provided on the lowermost memory chip of the memory chips, wherein the address identification circuit includes: a write circuit to set the variable resistance element to the same resistance state; a verification circuit to verify that the variable resistance element is set to the same resistance state in accordance with a read current supplied to the variable resistance element; a comparator having one input terminal connected with the chip top electrode of the first memory position detection pad, and the other input terminal supplied with a chip position detection signal, and comparing a voltage applied to the first memory position detection pad when the variable resistance element is set to the same resistance state with the chip position detection signal using the comparator when a voltage is applied between the first and second memory position detection pads provided on the uppermost layer memory chip; a test circuit determining a stacked position of the memory chip in accordance with the comparison result by the comparator to generate an inherent chip address; a storage storing the generated chip address; and an address comparator comparing the chip address stored in the storage with a chip address input from the outside in an operation.

BRIEF DESCRIPTION OF THE SEVERAL VIEWS OF THE DRAWING

FIG. 1 is a perspective view showing the structure of a semiconductor memory device (multi-chip package structure memory device) according to a first embodiment of the present invention;

FIG. 2 is a cross-sectional view showing the structure of the memory device according to the first embodiment;

FIG. 3 is a cross-sectional view to explain a current flow between first and second memory position detection pads in the memory device according to the first embodiment;

FIGS. 8A to 8C is a cross-sectional view to explain a method stacking memory chips in the memory device according to the first embodiment;

FIG. 9 is a circuit diagram showing the configuration of a chip address identification circuit included in a memory chip in the memory device according to the first embodiment;

FIG. 10 is a test voltage node selection table in a memory chip in the memory device according to the first embodiment;

FIG. 11 is a flowchart to explain a method of setting a resistance of a variable resistance element used for chip ID identification;

FIG. 12 is a circuit diagram showing the configuration of a chip address identification circuit to explain an operation for writing a resistance of a variable resistance element used for chip ID identification in the memory device according to the first embodiment;

FIG. 13 is a circuit diagram showing the configuration of a chip address identification circuit to explain an operation for verifying a resistance of a variable resistance element used for chip ID identification in the memory device according to the first embodiment;

FIG. 14 is a flowchart to explain a method of identifying a chip ID in the memory device according to the first embodiment;

FIG. 15 is a circuit diagram showing the configuration of a chip address identification circuit to explain an operation of identifying a chip ID in the memory device according to the first embodiment;

FIG. 16 is a circuit diagram showing principal parts of another configuration of a chip address identification circuit in the memory device according to the first embodiment;

FIG. 19 is a view showing the arrangement of a variable resistance element used for identifying a chip ID in the memory device according to the first embodiment;

FIG. 20 is a view showing another arrangement of a variable resistance element used for identifying a chip ID in the memory device according to the first embodiment;

DETAILED DESCRIPTION OF THE INVENTION

Figure 4:
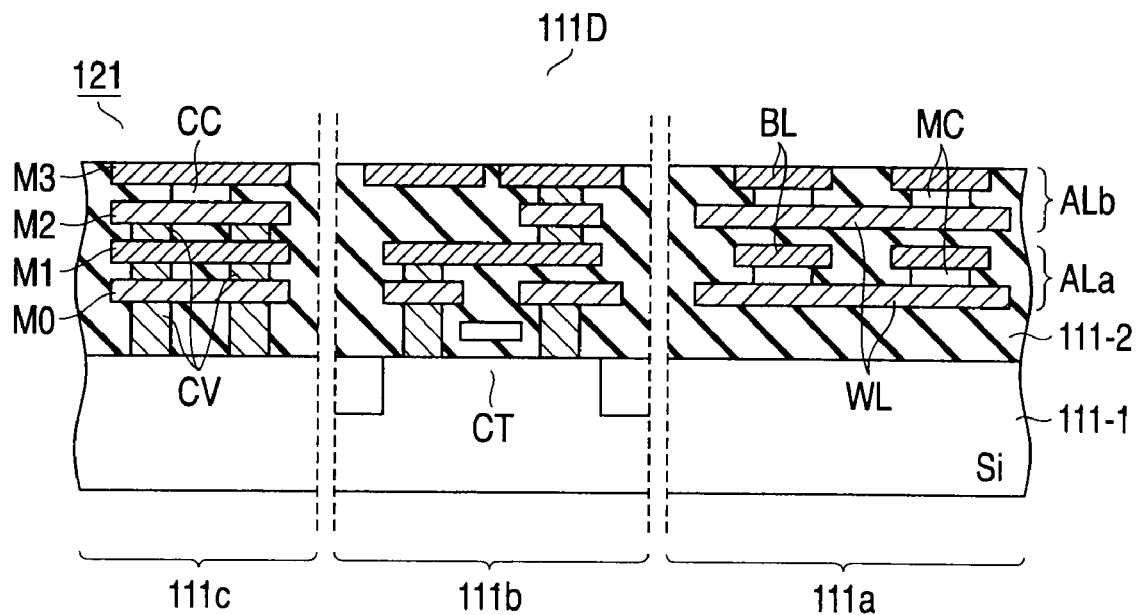
FIG. 4 is a cross-sectional view showing principal parts of the structure of a memory chip in the memory device according to the first embodiment.

Embodiments of the present invention will be described with reference to the accompanying drawings. It should be noted that the drawings are schematic ones and the dimension ratios shown therein are different from the actual ones. The dimensions vary from drawing to drawing and so do the ratios of dimensions. The following embodiments are directed to a device and a method for embodying the technical concept of the present invention and the technical concept does not specify the material, shape, structure or configuration of components of the present invention. Various changes and modifications can be made to the technical concept without departing from the scope of the claimed invention.

First Embodiment

FIG. 1 is a perspective view showing the structure of a multi-chip package structure memory device (semiconductor memory device) 100 according to a first embodiment of the present invention. According to the first embodiment, four resistance-change memory chips (hereinafter, referred to as memory chips) 111A to 111D using a resistance-change memory element as a memory cell are stacked in the same package.

As shown in FIG. 1, the memory device 100 of this embodiment includes four memory chips 111A to 111D, which are successively stacked on a package substrate 101. These four memory chips 111A to 111D each have the same configuration (specification), and stacked so that they are mutually overlapped vertically as a whole.

Each of the memory chips 111A to 111D is provided with a plurality of (nine in this embodiment) pads 121 to 129 and a chip address identification circuit 150. Of those pads 121 to 129, pads 121 and 122 are used as first and second memory position detection pad P1 (Vtest), and P2 (Vss) for recognizing a chip address, respectively. Other pads 123 to 129 are used as input/output (I/O), control, power supply (Vdd) and ground (Vss) pads, respectively, as seen from FIG. 2. The pads 121 to 129 of each of memory chips 111A to 111D are mutually connected (short-circuited) using a through via (vertical via technique) 103. For example, the pad 121 is given as one example. The through via 103 connects between the pad 121 of the memory chip 111A and the pad 121 of the memory chip 111B, between the pad 121 of the memory chip 111B and the pad 121 of the memory chip 111C and between the pad 121 of the memory chip 111C and the pad 121 of the memory chip 111D. The pad 121 of the memory chip 111A is connected to the package substrate 101 via the lowermost through via 103. Although described later, the pads 121 to 129 of each of the memory chips 111A to 111D have a through silicon via structure (TSV). According to the through silicon via structure (TSV), the pads 121 to 129 have an electrode on each of chip front and backside surfaces.

In FIG. 1, the first and second memory position detection pads 121 (P1) and 122 (P2) are short-circuited. According to this embodiment, the first and second memory position detection pads 121 (P1) and 122 (P2) are connected via a package frame conductor pattern 131 between the lowermost through vias 103 on the surface of the package substrate 101 as depicted in FIG. 2. Specifically, the first and second memory position detection pads 121 (P1) and 122 (P2) of the memory chips 111A to 111D are conducted using eight through vias 103 and one conductor pattern 131. Thus, a test voltage Vtest is applied to the first and second memory position detection pad 121 (P1) of the uppermost memory chip 111D from an external tester (not shown). The second memory position detection pads 122 (P2) of the memory chip 111D is connected to ground (Vss). In this way, a current flows from the first memory position detection pads 121 (P1) of the memory chip 111D to the second memory position detection pads 122 (P2) as shown by arrows in FIG. 3.

Although is not illustrated, the memory chips 111A to 111D on the package substrate 101 are sealed by a sealer such as resin at its surroundings except the pads 121 to 129 of the uppermost memory chip 111D.

FIG. 4 shows the configuration of each of the memory chips 111A to 111D. According to this embodiment, the memory chips 111A to 111D each have substantially the same configuration. Therefore, the memory chip 111D is given as an example, and a state before being the memory chip is stacked will be described below.

For example, the memory chip 111D has a memory array part 111a, a peripheral circuit part 111b and a pad part 111c. In the memory array part 111a, a plurality (two layers in this embodiment) of arrays ALa and ALb are provided (embedded) in an insulating film 111-2 on a silicon (Si) substrate 111-1. The array ALa has a plurality of memory cells (resistance-change memory elements) MC. Each memory cell MC is interposed between a word line formed of a first metal layer M0 and a bit line formed of a second metal layer M1. The array ALb has a plurality of memory cells (resistance-change memory elements) MC. Each memory cell MC is interposed between a word line formed of a third metal layer M2 and a bit line formed of a fourth metal layer M3.

The peripheral circuit part 111b is formed with a desired circuit (e.g., select transistor CT) using the first to fourth metal layers M0 to M3.

The pad part 111c is a via region, which is provided with the foregoing pads 121 to 129. These pads 121 to 129 each have a through silicon via structure (TSV). For example, of the pads 121 to 129, each of the pads 122 to 129 is composed of a first metal layer (chip bottom electrode) M0, a second metal layer M1, a third metal layer M2, a fourth metal layer (chip top electrode) M3 and a contact via CV (not shown). In this case, the contact via CV connects between the silicon substrate 111-1 and the first metal layer M0 and between the metal layers M0 to M3. The pad 121 is composed of a first metal layer (chip bottom electrode) M0, a second metal layer M1, a third metal layer M2, a fourth metal layer (chip top electrode) M3, a contact via CV and a variable resistance element (high resistance element) CC. In this case, the contact via CV connects between the silicon substrate 111-1 and the first metal layer M0 and between the metal layers M0 to M2. The variable resistance element CC is interposed between the third and fourth metal layers M2 and M3. In other words, in the pad 121, the contact via CV interposed between the third and fourth metal layers M2 and M3 of the pads 122 to 129 is replaced with the variable resistance element CC. According to this embodiment, the variable resistance element CC is formed having the same configuration as the foregoing memory cell MC.

In this embodiment, of the first memory position detection pad 121 (P1) has one terminal (e.g., top (chip front) side fourth metal layer M3) and the other terminal (e.g., bottom (chip backside) side first metal layer M0). The foregoing one terminal is drawn outside the memory chips 111A to 111D as a test pad TT, and the foregoing other terminal is drawn outside the memory chips 111A to 111D as a test pad TB.

Figure 5:
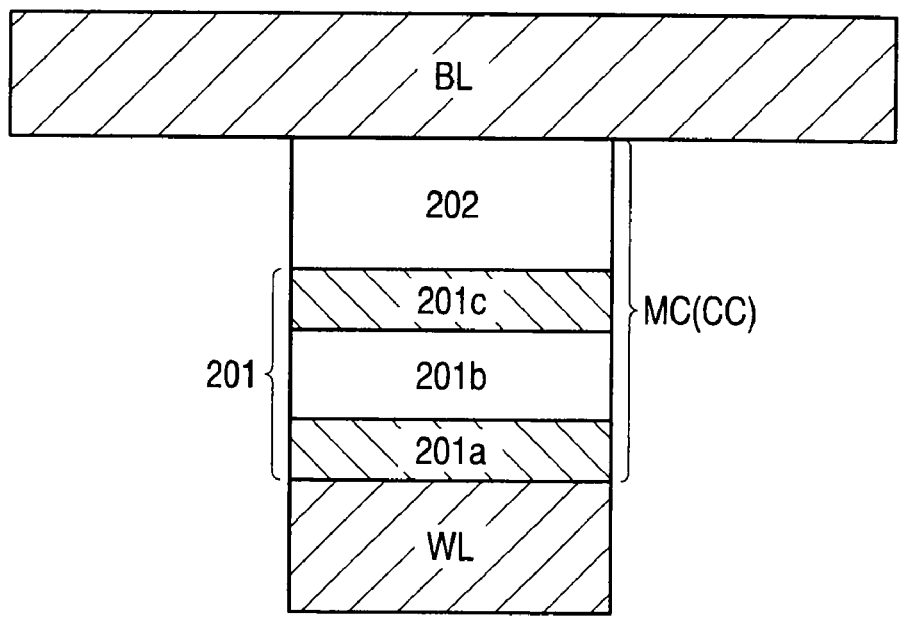
FIG. 5 is a cross-sectional view showing the structure of a memory cell in the memory device according to the first embodiment.

FIG. 5 shows a sectional structure of a memory cell MC taken along a bit line BL direction. The memory cell MC comprises a serial circuit, which is composed of a variable resistance element 201 and a nonlinear element 202. The variable resistance element 201 has a bottom electrode 201a, a variable resistor 201b and a top electrode 201c. Specifically, the variable resistor 201b is formed on the bottom electrode 210a, and stores data by a change of resistance caused by electrical stress. The top electrode 201c is formed on the variable resistor 201b. The bottom electrode 201a of the variable resistance element 201 is connected with a word line WL. The nonlinear element 202 is a two-terminal element such as diode, which has a nonlinear current-voltage characteristic of bidirectionally carrying a current. The nonlinear element 202 is provided on the variable resistance element 201. In other words, the nonlinear element 202 has one terminal connected to the top electrode 201c of the variable resistance element 201. The nonlinear element 202 further has the other terminal connected to a bit line BL.

Incidentally, the nonlinear element 202 may be formed on or under the variable resistance element 201.

When a voltage is applied to the variable resistance element 201, the resistance changes, and then, the changed resistance is maintained after the voltage application is released.

Namely, the memory cell MC including the variable resistance element 201 is a non-volatile memory element capable of storing data by a change of the resistance. For example, transition metals such as Cu, Ni, Mn and Zr are used as the variable resistor 201b forming the variable resistance element 201.

Figure 6:
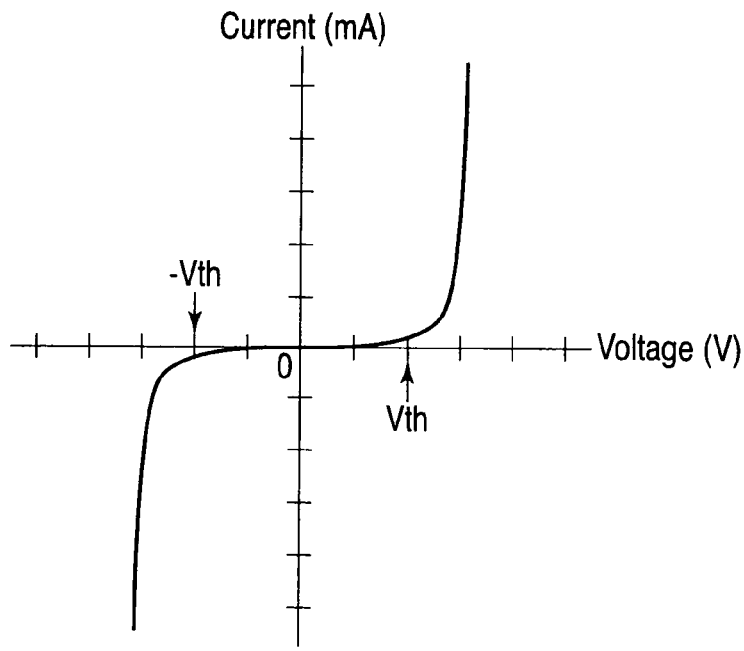
FIG. 6 is a characteristic chart to explain current and voltage characteristics of a nonlinear element in the memory device according to the first embodiment.

The following device is preferable as the nonlinear element 202 because a current bidirectionally flows in a data rewrite operation of the memory cell MC. The device has a current-voltage characteristic, which is bidirectionally symmetrical and nonlinear as seen from FIG. 6.

Although the detailed explanation is omitted herein, the formation process is made the same (common), and thereby, the variable resistance element CC is formed having the same configuration as the foregoing memory cell MC. In this case, the variable resistance element CC of the first memory position detection pad 121 (P1) is used as a high resistance element for recognizing a chip address described later.

According to this embodiment, the variable resistance element CC of each first memory position detection pad 121 (P1) of the memory chips 111A to 111D is set to have higher resistance than the contact via CV of each second memory position detection pad 122 (P2). Specifically, data is falsely written to the variable resistance element CC of the first memory position detection pad 121 (P1) so that the variable resistance element CC forcedly has high resistance.

Figure 7:
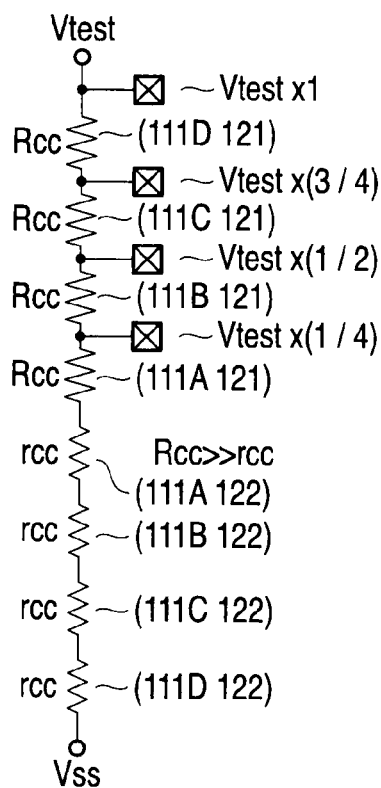
FIG. 7 is a circuit diagram showing the configuration of a serial circuit comprising resistance elements using a variable resistance in the memory device according to the first embodiment.

In the manner described above, the variable resistance element CC of the first memory position detection pad 121 (P1) is made high resistance. In this way, as illustrated in FIG. 7, a serial connection having a resistance Rcc is realizable using the variable resistance element CC. Therefore, when a test voltage Vtest is applied to the first memory position detection pad 121 (P1) of the uppermost memory chip 111D, the following voltage is given. Specifically, different voltages (Vtest×1, Vtest×(¾), Vtest×(½), Vtest×(¼) are applied to the first memory position detection pads 121 (P1) of the stacked memory chips 111A to 111D.

The resistance Rcc shown in FIG. 7 is generally a resistance of the variable resistance element CC in the first memory position detection pads 121 (P1) of the memory chips 111A to 111D. The resistance rcc is generally a resistance of the contact via CV in the second memory position detection pads 122 (P2). In addition, the relationship of resistances Rcc and rcc is Rcc>>rcc.

As the necessity arises, the through via 103 connecting between the first memory position detection pad 121 (P1) may be formed to have a higher resistance than other trough vias 103. Specifically, for example, a high-resistance material such as carbon is used as the material for forming the through via 103 connecting between the first memory position detection pads 121 (P1) (e.g., solder having a low resistance is used to form other through vias 103). In order to achieve high resistance, metal oxide (high-resistance material) such as alumina may be embedded in the trough via 103 only connecting between the first memory position detection pads 121 (P1). In addition, the diameter of the trough via 103 connecting between the first memory position detection pads 121 (P1) is set smaller than that of other through vias 103. In this way, the first memory position detection pads 121 (P1) may be realized to have high resistance. In addition, the second memory position detection pads 122 (P2) is formed to have the same configuration as the first memory position detection pad 121 (P1). Then, data is not written to the variable resistance element of the second memory position detection pads 122 (P2) to keep a low resistance. In this way, high resistance of the first memory position detection pads 121 (P1) can be achieved.

FIGS. 8A to 8C shows a method of stacking the memory chips 111A to 111D. The case of stacking the memory chip 111D on the memory chip 111C is given as an example. Based on the foregoing example, the case of electrically connecting the first memory position detection pads 121 (P1) will be described below.

For example, when the memory chip 111D is stacked on the memory chip 111C, the silicon substrate 111-1 of the pad part 111c of the memory chip 111D is formed with a opening portion 141 connected to the pad 121 (see FIG. 8A). Then, a via plug (bottom electrode) 103a is formed along an inner wall of the opening portion 141 (see FIG. 8B). Thereafter, the via plug 10a and the pad 121 (fourth metal layer M3) of the lower-layer memory chip 111C are connected via a connection bump (top electrode) 103b (see FIG. 8C). In this way, the memory chip 111D is stacked on the memory chip 111C. Simultaneously, the pad 121 of the memory chip 111C and the pad 121 of the memory chip 111D are electrically connected via the through via 103 comprising the via plug 103a and the connection bump 103b.

In fact, each foregoing process is simultaneously carried out with respect to all of the pads 121 to 129. The same process a above is carried out when the memory chip 111A is stacked on the package substrate 101, when the memory chip 111B is stacked on the memory chip 111A and when the memory chip 111C is stacked on the memory chip 111B. In this way, the multi-chip package structure memory device 100 shown in FIG. 1 is obtained. The multi-chip package structure memory device 100 has a configuration that pads 121 to 129 are electrically connected between the stacked (MCP) memory chips 111A to 111D.

FIG. 9 shows the configuration of a chip address identification circuit 150 included in each of the memory chips 111A to 111D. The chip address identification circuit 150 recognizes in which layer each of the memory chips 111A to 111D is stacked in the same package from the following factor. The factor is a magnitude relationship between a comparison signal (chip position detection signal) generated based on a memory position detection voltage Vext and an input signal given from the outside of the package (memory chips 111A to 111D).

Specifically, each of the memory chips 111A to 111D is provided with the chip address identification circuit 150. The chip address identification circuit 150 includes a built-in self test (BIST) circuit 151, a ROM-FUSE (storage) 152, a register 153, a comparator 154, an address comparator 155. The circuit 150 further includes a memory position detection circuit 156, a write circuit (p-MOS transistor) 157, a verification circuit (p-MOS transistor) 158, and an n-MOS transistor 159.

The BIST circuit 151 controls on/off of switches S1 to S5 for selecting a node of the memory position detection circuit 156. Inherently, the BIST circuit 151 determines a position of the stacked memory chip (i.e., stacked order of the corresponding memory chip in the package 100) in accordance with the following comparison result (magnitude relationship). The comparison result is obtained by comparing the following two parameters. One is a partial pressure signal (comparison signal) of a memory position detection voltage Vext input from the selected node. Another is a partial pressure voltage of a test voltage test applied to the first memory position detection pad 121. The obtained result is stored in the ROM-FUSE 152 (ID write) as an inherent chip address.

The ROM-FUSE 152 is a memory, which stores the correspondence of a chip address of the corresponding memory chip and the control information such as write voltage, read voltage and erase voltage of the memory chip.

The register 153 temporarily holds control information read from the ROM-FUSE 152 in accordance with a chip address input from the address comparator 155 when an operation test is carried out.

The comparator 154 is supplied with the following signals to an inverted input terminal (−) and a non-inverted input terminal (+). The inverted input terminal (−) is supplied with a partial pressure signal supplied from the memory position detection circuit 156. The non-inverted input terminal (+) is supplied with an input signal from a test pad TT (partial pressure voltage of the test voltage Vtest applied to the first memory position detection pad 121). Then, the comparator 154 compares the partial pressure signal with the input signal, and thereafter, outputs the comparison result (magnitude relationship) to the BIST circuit 151. The comparator is further used to verify a resistance (Rcc) of the variable resistance element CC of the first memory position detection pad 121.

The address comparator 155 compares chip addresses input from the pads 123 and 124 with a chip address read from the ROM-FUSE 152 via the register 153 to specify (select) operation target memory chips 111A to 111D. Thereafter, the address comparator 155 outputs the specified chip address to the register 153.

The memory position detection circuit 156 includes resistors R1 to R4 having a resistance R and a resistor r having a resistance R/2, which are series-connected. The circuit 156 further includes switches S1 to S5 connected to nodes for connecting resistors R1 to R4 and r. Resistors R1 to R4 and r are formed in a manner that a polysilicon resistor is series-connected in each of the memory chips 111A to 111D. The node connected with resistor R1 and switch S1 has applied to it a memory position detection voltage Vext from a tester. Each of the nodes connecting resistors R1 to R4 and r is selected by the BIST circuit 151 controlling on/off of switches S1 to S5. A partial pressure ratio of the memory position detection voltage Vext is determined by the selected node. In accordance with the partial pressure ratio, a partial pressure signal of the memory position detection voltage Vext is input to the inverted input terminal of the comparator 154.

The write circuit 157 sets the variable resistance element CC of the first memory position detection pad 121 (P1) of each of the memory chips 111A to 111D to the same resistance (Rcc). The write circuit 157 falsely writes data to the corresponding variable resistance element CC using a program voltage VPCM. The write circuit 157 is connected with a test pad TB and the n-MOS transistor 159 via the variable resistance element CC.

The verification circuit 158 verifies a write state of the variable resistance element CC (whether or not the resistance is Rcc) using a read current Iread. The verification circuit 158 is connected with a test pad TB and the n-MOS transistor 159 via the variable resistance element CC.

In FIG. 7, there is shown the relationship of partial pressure voltage given to each first memory position detection pad 121 (P1) of the memory chips 111A to 111D when the test voltage Vtest is applied. In the chip address identification circuit 150 shown in FIG. 9, the test pad TT is supplied with an input signal (voltage) corresponding to the partial pressure voltage applied to each first memory position detection pad 121 (P1) of the memory chips 111A to 111D from an external tester. Thereafter, the comparator 154 compares the input signal with an already-known partial pressure signal (voltage) generated in the memory position detection circuit 156. In this way, it is impossible to recognize which layer the corresponding memory chip is stacked. The voltage used for recognizing the memory chips 111A to 111D is written to the ROM-FUSE 152, and thereby, it is possible to hold an inherent chip address of each of the memory chips 111 to 111D.

FIG. 10 shows the relationship (test voltage node select table 300) between a partial pressure voltage of the test voltage Vtest input from a tester and an on/off operation of switches S1 to S5 of the memory position detection circuit 156. In the test voltage node select table 300, a symbol "V@ (Test Pad)" denotes a partial pressure voltage of the test voltage Vtest. A symbol "V@Sample Node" denotes an on/off state of switches S1 to S5 for selecting the node of the memory position detection circuit 156. In this case, "0" denotes an off state of switches S1 to S5 while "1" denotes an on state of switches S1 to S5. In the table of FIG. 10, "7/9, 5/9, 3/9 and 1/9" denote a combined resistance. Specifically, these resistances are based on each resistance R and R/2 of resistors R1 to R4 and r connected between the nodes selected by an on/off operation of switches S1 to S5. The test voltage node select table 300 is used for a chip address (ID) write operation by a tester described later.

According to the test voltage node select table 300, the following correspondence relationship is given. For example, if a tester inputs a test voltage Vtest "1" to the test pad TT of the memory chip 111D to execute an ID write operation, the BIST circuit 151 turns on switch S1 only while turns off all of switches S2 to S5. For example, if the tester inputs a test voltage Vtest "0.75" to the test pad TT of the memory chip 111D to execute an ID write operation, the BIST circuit 151 turns on switch S2 only while turns off all of switches S1, S3 to S5. For example, if the tester inputs a test voltage Vtest "0.5" to the test pad TT of the memory chip 111D to execute an ID write operation, the BIST circuit 151 turns on switches S2 and S3 while turns off switches S1, S4 and S5. For example, if a tester inputs a test voltage Vtest "0.25" to the test pad TT of the memory chip 111D to execute an ID write operation, the BIST circuit 151 turns on switches S2 to S4 while turns off switches S1 and S5. The same correspondence relationship as above is given in the memory chips 111A to 111C.

In the memory device 100 shown in FIG. 1, a method (@D/S) of setting a resistance of the variable resistance element CC of the first memory position detection pad 121 (P1) of each of the memory chips 111A to 111D will be described with reference to a flowchart shown in FIG. 11. Herein, the memory chip 111D is given as an example, and he variable resistance element CC of the first memory position detection pad 121 (P1) is made high resistance.

A resistance of the variable resistance element CC interposed between the test pads TT and TB of the first memory position detection pad 121 (P1) of the memory chip 111D is written. In this case, as shown in FIG. 12, the write circuit 157 and the n-MOS transistor 159 are turned on by a tester (the verification circuit 158 is in an off state). In this way, the variable resistance element CC has applied to it a program voltage VPGM so that the resistance of the element CC is changed (set to high resistance) (step S401 in FIG. 11).

In order to verify the set resistance of the variable resistance element CC, the tester turns on the verification circuit 158 and the n-MOS transistor 159 as seen from FIG. 13 (the write circuit 157 is in an off state). In this way, the variable resistance element CC is supplied with a read current Iread from the verification circuit 158. In addition, the tester applies a memory position detection voltage Vext to the memory position detection circuit 156 (step S402 in FIG. 11).

The foregoing read current Iread is controlled in the following manner. Specifically, the direction of the voltage applied to the variable resistance element CC (i.e., direction of current applied to the variable resistance element in chip position detection) becomes the same as the direction of electric field applied in setting (i.e., direction of write current applied to the variable resistance element by the write circuit). Namely, the set resistance of the variable resistance element CC is prevented from being changed, and thereby, reliability is improved.

Thereafter, the comparator 154 compares a voltage signal of the test pad TT with a partial pressure voltage applied from the memory position detection circuit 156 in accordance with the resistance of the variable resistance element CC. Based on the compared result, the tester checks the resistance of the variable resistance element CC (step S403 in FIG. 11). In this case, the BIST circuit 151 turns on switch S1 only of the memory position detection circuit 156 so that the memory position detection voltage Vext is input to the comparator 154.

The tester determines that the variable resistance element CC has high resistance equivalent to a desired resistance (Rcc) based on the magnitude relationship between the following voltages. One is the voltage signal corresponding to the resistance of the variable resistance element CC. Another is the memory position detection voltage Vext applied from the memory position detection circuit 156 (step S403: okay, step S404 in FIG. 11). In this case, the operation for setting the resistance of the variable resistance element CC of the memory chip 111D ends.

Conversely, if it is determined that the variable resistance element CC does not have high resistance equivalent to a desired resistance (Rcc) (step S403 in FIG. 11: fail), the program voltage VPGM is incremented by a predetermined voltage (step S405 in FIG. 11. Then, the foregoing operations from steps S401 to S403 are repeated.

In this way, the variable resistance element CC of the first memory position detection pad 121 (P1) of the memory chips 111A to 111D is set to have the same resistance (Rcc).

In the memory device 100 shown in FIG. 1, the test sequence of an ID write/read operation test executed by a tester will be described with reference to a flowchart shown in FIG. 14. According to the test sequence, the case of executing a chip ID recognition operation (@pkg) of the memory chip 111D is given as an example.

In order to execute an ID write operation of the memory chip 111D, a tester does not activate (turn off) the write circuit 157, the verification circuit 158 and the n-MOS transistor 159 of the chip address identification circuit 150. For example, as shown in FIG. 15, the tester applies a memory position detection voltage Vext to the memory position detection circuit 156 (step S501 in FIG. 14).

Thereafter, the tester inputs a test voltage Vtest equivalent to the ID of the memory chip 111D to the test pad TT, and then, monitors the result (step S502 in FIG. 14). In other words, the tester inputs a test voltage Vtest shown in the foregoing test voltage node select table 300 to the test pad TT. The BIST circuit 151 of the chip address identification circuit 150 controls on/off of switches S1 to S5 corresponding to a test voltage Vtest shown in the foregoing test voltage node select table 300. In this way, the BIST circuit 151 supplies a partial pressure signal of the memory position detection voltage Vext to the comparator 154. Then, the comparator 154 compares the test voltage Vtest input from the test pad TT with the partial pressure signal input from the memory position detection circuit 156, and thereafter, outputs the comparison result to the BIST circuit 151. In this way, the BIST circuit 151 determines the position where the memory chip 111D is stacked based on the input comparison result, and then, stores the result in the ROM-FUSE 152 as an inherent chip address (step S503 in FIG. 14).

In order to test an ID read operation of the memory chip 111D, the tester inputs an ID read command and the chip address via the pads 123 and 124, for example. When the chip address is input from the pads 123 and 124, the address comparator 155 of the chip address identification circuit 150 compares the input chip address with a chip address via the register 153 from the ROM-FUSE 152. If the foregoing two addresses coincide, the comparator 155 outputs the chip as chip information to the tester from the pads 123 and 124 (step S504 in FIG. 14: okay).

In the manner described above, if the tester confirms each ID read operation with respect to each chip address (step S504 in FIG. 14: okay), the tester can recognize that each chip ID write of the memory chips 111a to 111D fully ends (step S505 in FIG. 14). Conversely, if the tester does not recognize the ID read operation with respect to any chip address (step S504 in FIG. 14: fail), the tester recognizes that the chip ID write of the corresponding memory chip fails (step S506 in FIG. 14). In this case, the tester immediately executes again the ID write operation with respect to the corresponding memory chip.

After all chip addresses written to each ROM-FUSE 152 are confirmed, any of the memory chips 111a to 111D is selected depending on the result whether or not the chip address set from the ROM-FUSE 152 to the register 153 coincides with the chip address supplied to the pads 123 and 124 in each operation.

The following is a description of a method of designating a chip address when delivering a memory device 100 stacking a plurality of memory chips 111A to 111D having written chip address in the above manner as a product.

The ID read operation is used as the method of designating the chip address. In this case, a chip enable (CE) command used for the ID read operation is used. Specifically, the CE command has two-bit configuration, any of "00", "01", "10" and "11" is set, and thereby, any chip address of four memory chips 111A to 111D stacked in the memory device 100 is designated.

An address command of designating an address in the memory chips is used as another method of designating the chip address. In this case, the number of bits of the address command is different in accordance with the capacity of the memory array part 111a; however, the upper two bits are used. Specifically, any of "00", "01", "10" and "11" is set as the upper two bits, and thereby, any chip address of four memory chips 111A to 111D stacked in the memory device 100 is designated.

In the memory device 100 including the chip address identification circuit 150, a test voltage from the tester is applied to the first and second memory position detection pads 121 (P1) and 122 (P2) of the uppermost (uppermost layer) memory chip 111D. For this reason, pins must be provided outside the memory device 100. The pins are necessary for a test before delivery, and not necessary after delivery. Thus, no connection (NC) pins are set on specifications.

In particular, the first and second memory position detection pads 121 (P1) and 122 (P2) are connected to a power supply pin and a VSS pin, respectively, and thereby, the number of the NC pins is reduced to zero. In this case, for example, a switch element SE shown in FIG. 16 must be interposed between the chip top and bottom electrodes (TT) and (TB) of the first memory position detection pad 121 (P1). The switch element SE is controlled to be turned on in chip address identification only.

The second memory position detection pad 122 (P2) is connectable with a ground terminal without being drawing outside. The first memory position detection pad 121 (P1) is connectable with a power supply terminal without being drawing outside. Thus, any one of the first and second memory position detection pads 121 (P1) and 122 (P2) is connected to a terminal, and thereby, the number of the NC pins can be reduced one.

As described above, the following advantage is obtained in the multi-chip package structure memory device stacking resistance-change memory chips using a resistance-change memory element as a memory cell. Namely, the identification function for identifying the chip address of the memory is realized using the variable resistance element having the same configuration as the memory cell.

In other words, the variable resistance element, which is simultaneously formed via the process common to the memory cell, is used as the memory position detection pad when a plurality of memory chips is stacked. In this way, the test voltage for ID write and read operations is applied so that the memory position detection pad has high resistance. Thus, the memory position detection pad is formed without adding a special process such that a vertical via is made high resistance. Therefore, even if the memory chips are vertically stacked so that short circuit is given between pads, the identification function for recognizing the position of the memory chip is simply realized.

Figure 17:
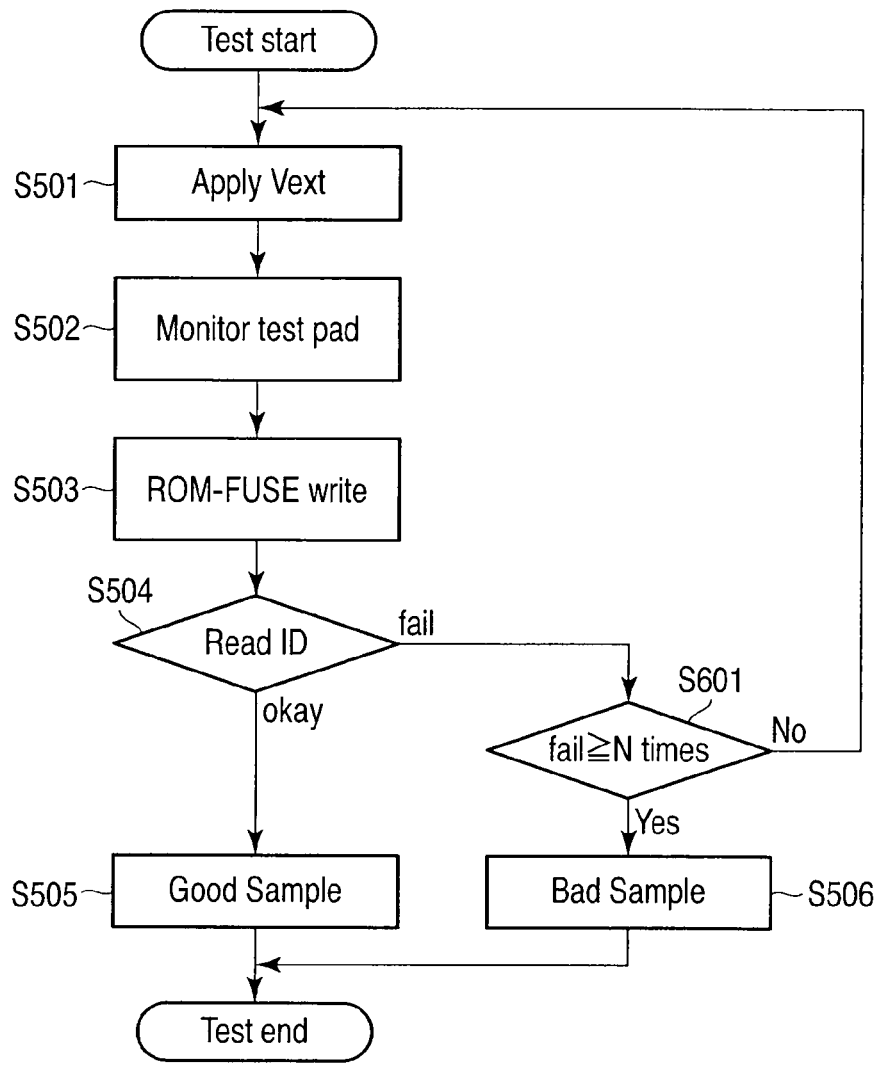
FIG. 17 is a flowchart to explain another method of identifying a chip ID in the memory device according to the first embodiment.

According to the foregoing embodiment, if the ID read operation is not confirmed with respect to any chip address (step S504 in FIG. 14: fail), the chip ID write of the corresponding memory chip fails; as a result, the test ends. However, the present invention is not limited to above. For example, the ID read operation may be repeated several times to determine whether or not the chip ID write of the corresponding memory chip fails. Specifically, as shown in FIG. 17, the procedures from steps S501 to S504 in FIG. 14 are carried out. As a result, if the ID read operation is not confirmed (step S504: fail), it is confirmed whether or not the number of fail times reaches N times (e.g., five times) (step S601). If the number of fail times does not reach N times (step S601: No), the procedure returns to step S501, and then, the procedures from steps S501 to S504 in FIG. 14 are carried out. Conversely, if the number of fail times reaches N times (step S601: Yes), it is recognized that the chip ID write of the corresponding memory chip fails (step S506). In this case, the tester automatically repeats the ID write with respect to the memory chip again; therefore, it is securely determined whether or not the corresponding memory chip is defective.

Figure 18:
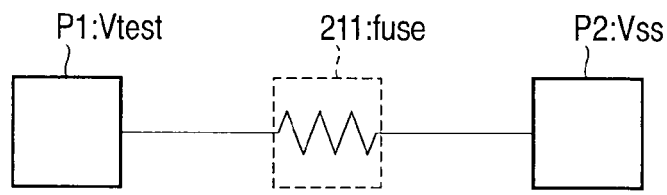
FIG. 18 is a view showing another configuration of first and second memory position detection pad in the memory device according to the first embodiment.

According to the foregoing embodiment, the first and second memory position detection pads 121 (P1) and 122 (P2) are independently formed. However, the present invention is not limited to above. For example, as shown in FIG. 18, a fuse 211 formed of metal or well may be previously connected between the first and second memory position detection pads 121 (P1) and 122 (P2) formed on each of the memory chips 111A to 111D. When the foregoing lower opening portion 141 is formed, the fuses 211 of the memory chips 111B to 111D other than the lowermost memory chip 111A are electrically shut.

As described above, the fuse 211 previously connects between the first and second memory position detection pads 121 (P1) and 122 (P2). This serves to dispense the conductor pattern 131 connecting between the first and second memory position detection pads 121 (P1) and 122 (P2) in the lowermost memory chip 111A. Therefore, it is possible to simplify the structure of the memory chips 111A to 111D in the memory device 100.

According to the foregoing embodiment, the first and second memory position detection pads 121 (P1) and 122 (P2) are formed in a via region formed with a plurality of through vias 103. However, the present invention is not limited to above. For example, these pads may be formed in other free region on the memory chips 111A to 111D.

For example, as shown in FIG. 19, a plurality of dummy elements DC may be arrayed around the variable resistance element CC of the first memory position detection pad 121 (P1) used for recognizing a chip ID. In this case, the variable resistance element CC is formed under the same environment (condition) as a normal memory cell, and the reliability of the variable resistance element CC is improved.

For example, as illustrated in FIG. 20, the dimension of the variable resistance element CC of the first memory position detection pad 121 (P1) used for recognizing a chip ID may be set larger than that of a normal memory cell. The variable resistance element CC is formed larger in its dimension, and thereby, the reliability of the variable resistance element CC is improved.

Figure 21:
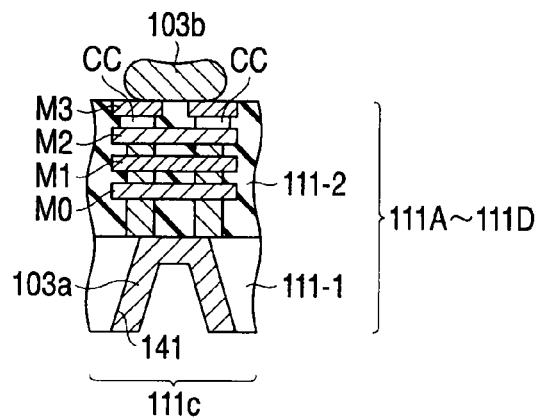
FIG. 21 is a cross-sectional view showing another structure of a first memory position detection pad used for identifying a chip ID in the memory device according to the first embodiment.

According to the foregoing embodiment, one variable resistance element CC is formed with respect to the first memory position detection pad 121 (P1) used for recognizing a chip ID. However, the present invention is not limited to above. For example, as seen from FIG. 21, a plurality of variable resistance elements CC is prepared between the test pads TT and TB of the first memory position detection pad 121 (P1). When stacking is carried out, short circuit is given between the variable resistance elements CC using a connection bump 103b such as solder. Simultaneously, the first memory position detection pads 121 (P1) of the memory chips 111A to 111D may be mutually connected. The foregoing structure is employed, and thereby, a non-uniform component of each variable resistance element CC is averaged; therefore, this serves to improve the reliability of the chip ID read operation.

Figure 22:
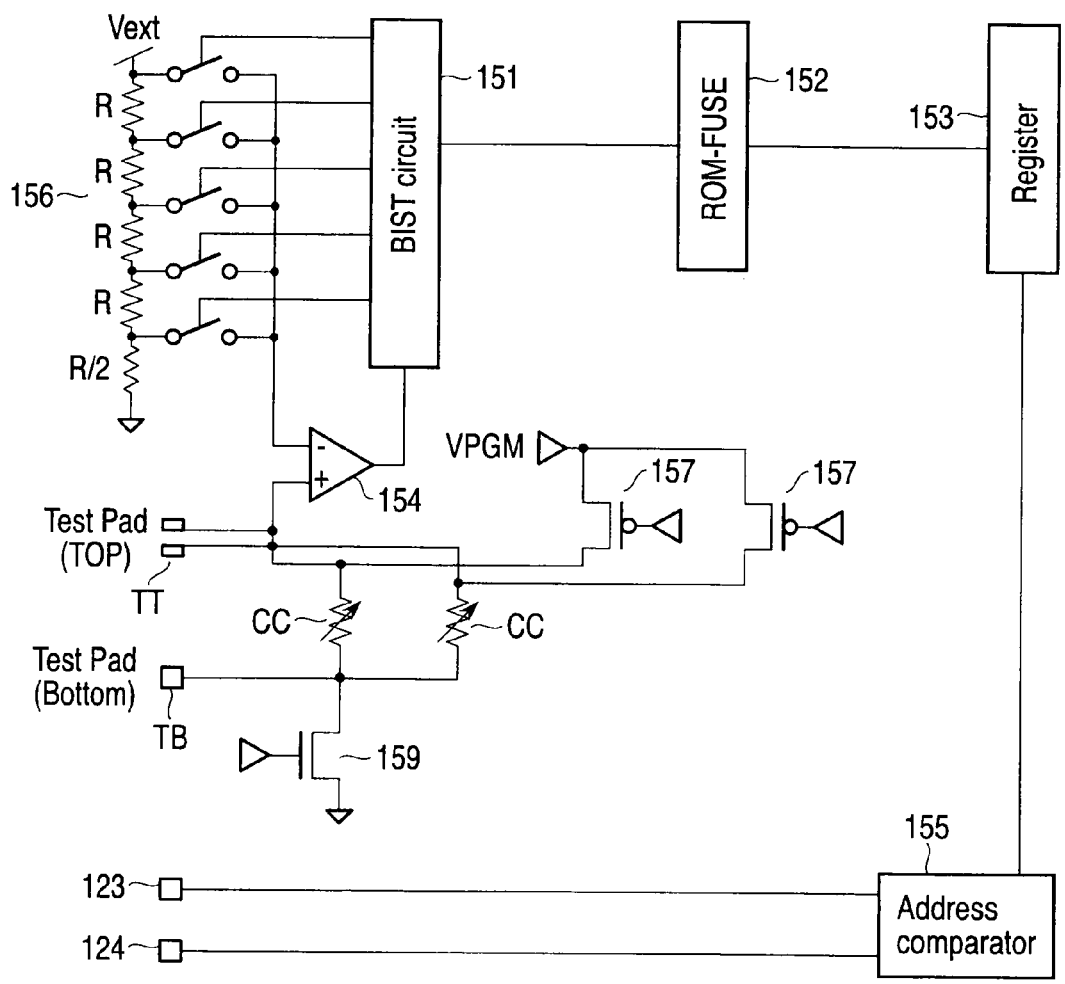
FIG. 22 is a circuit diagram showing the configuration of a chip address identification circuit to explain an operation for setting a resistance of a variable resistance element in the first memory position detection pad.

However, there is a need of independently setting the resistance of the variable resistance element CC. For this reason, the chip is not short-circuited as a single unit (short circuit is given after the resistance is set; for example, stacking process). Specifically, the resistance of each variable resistance element CC is set in the following manner. For example, as depicted in FIG. 22, the resistance is independently written and verified using independent write circuit 157, 157 and verification circuit (not shown).

According to the foregoing embodiment, the number of stacked memory chips and the number of array stacked layers in each memory chip are not limited, of course.

Additional advantages and modifications will readily occur to those skilled in the art. Therefore, the invention in its broader aspects is not limited to the specific details and representative embodiments shown and described herein. Accordingly, various modifications may be made without departing from the spirit or scope of the general inventive concept as defined by the appended claims and their equivalents.

What is claimed is:

1. A semiconductor memory device including a plurality of memory chips each using a resistance-change memory element as a memory cell, and having a pad part having a through silicon via structure (TSV) including a chip top electrode of a chip surface and a chip bottom electrode of a chip backside, comprising:
the memory chips each including:
a first memory position detection pad provided at the pad part;
a second memory position detection pad provided at the pad part;
at least one variable resistance element provided corresponding to the first memory position detection pad, the variable resistance element having one terminal connected to the chip top electrode of the first memory position detection pad, and the other terminal connected to the chip bottom electrode of the first memory position detection pad; and a comparator having one input terminal connected with the chip top electrode of the first memory position detection pad, and the other input terminal supplied with a chip position detection signal, the memory chips being configured so that the first and second memory position detection pads are connected via the chip top and bottom electrodes facing each other, of the vertically stacked memory chips, the chip bottom electrode of the first memory position detection pad and the chip bottom electrode of the second memory position detection pad provided on the lowermost memory chip being connected, the memory chips each controlling the variable resistance element, and in a state that the first memory position detection pad has a higher resistance than the second memory position detection pad, comparing a voltage applied to the first memory position detection pad with the chip position detection signal using the comparator when a voltage is applied between the first and second memory position detection pads provided on the uppermost layer memory chip, and thereby, detecting a stacked position of the memory chip in the package and recognizing a chip address in accordance with the stacked position from the comparison result.

2. The device according to claim 1, wherein the variable resistance element has the same configuration as the resistance-change memory element forming the memory cell.

3. The device according to claim 1, wherein each of the memory chips further includes a write circuit to set the variable resistance element to the same resistance state, and a verification circuit to verify that the variable resistance element is set to the same resistance state.

4. The device according to claim 3, wherein the verification circuit supplies a predetermined read current to the variable resistance element to verify that the variable resistance element is set to the same resistance state.

5. The device according to claim 3, wherein the direction of the current applied to the variable resistance element by the write circuit is the same as the direction applied to the variable resistance element in a chip position detection.

6. The device according to claim 1, wherein each of the memory chips further includes storage to store the recognized chip address, and an address comparator to compare the chip address stored in the storage with a chip address input from the outside in an operation.

7. The device according to claim 1, wherein the resistance-change memory element is a nonvolatile memory element capable of storing data by a change of resistance, and comprises a serial circuit composed of a variable resistance element and a nonlinear element.

8. The device according to claim 7, wherein the resistance-change memory element includes a bottom electrode, a variable resistor storing data by a resistance change due to electrical stress, and a top electrode.

9. The device according to claim 7, wherein the nonlinear element is a two-terminal element, which has a nonlinear current-voltage characteristic capable of bidirectionally carrying a current.

10. The device according to claim 1, wherein a switch element is connected in series with the variable resistance element between the chip top and bottom electrodes of the first memory position detection pad.

11. The device according to claim 1, wherein the memory chips are configured so that a fuse is previously connected between the first and second memory position detection pads.

12. The device according to claim 1, wherein a plurality of dummy elements is arrayed around the variable resistance element.

13. The device according to claim 1, wherein the variable resistance element has a dimension larger than the memory cell.

14. The device according to claim 1, wherein the variable resistance element is provided several with respect to the first memory position detection pad.

15. A semiconductor memory device comprising:
a plurality of memory chips vertically stacked in one package,
the memory chips each including:
a plurality of memory cells using a resistance-change memory element;
a through silicon via structure (TSV) pad including first and second memory position detection pads, and having a chip top electrode on a chip surface and a chip bottom electrode of a chip backside;
at least one variable resistance element provided corresponding to the first memory position detection pad, the variable resistance element having the same configuration as the memory cell, and having one terminal connected to the chip top electrode of the first memory position detection pad, and the other terminal connected to the chip bottom electrode of the first memory position detection pad; and
an address identification circuit detecting a stacked position of the corresponding memory chip in the package, and recognizing a chip address in accordance with the stacked position,
the memory chips further including:
a via connecting the first memory position detection pads and the second memory position detection pads via the chip top and bottom electrodes facing each other; and
a conductor pattern connecting the chip bottom electrode of the first memory position detection pad and the chip bottom electrode of the second memory position detection pad provided on the lowermost memory chip of the memory chips,
wherein the address identification circuit includes:
a write circuit to set the variable resistance element to the same resistance state;
a verification circuit to verify that the variable resistance element is set to the same resistance state in accordance with a read current supplied to the variable resistance element;
a comparator having one input terminal connected with the chip top electrode of the first memory position detection pad, and the other input terminal supplied with a chip position detection signal, and comparing a voltage applied to the first memory position detection pad when the variable resistance element is set to the same resistance state with the chip position detection signal using the comparator when a voltage is applied between the first and second memory position detection pads provided on the uppermost layer memory chip;
a test circuit determining a stacked position of the memory chip in accordance with the comparison result by the comparator to generate an inherent chip address;
a storage storing the generated chip address; and
an address comparator comparing the chip address stored in the storage with a chip address input from the outside in an operation.

16. The device according to claim 15, wherein a switch element is connected in series with the variable resistance element between the chip top and bottom electrodes of the first memory position detection pad.

17. The device according to claim 15, wherein the memory chips are configured so that a fuse is previously connected between the first and second memory position detection pads.

18. The device according to claim 15, wherein a plurality of dummy elements is arrayed around the variable resistance element.

19. The device according to claim 15, wherein the variable resistance element has a dimension larger than the memory cell.

20. The device according to claim 15, wherein the variable resistance element is provided several with respect to the first memory position detection pad.

* * * * *